United States Patent [19]
Spielberger et al.

[11] Patent Number: 6,005,778
[45] Date of Patent: Dec. 21, 1999

[54] CHIP STACKING AND CAPACITOR MOUNTING ARRANGEMENT INCLUDING SPACERS

[75] Inventors: Richard K. Spielberger, Maple Grove; Ronald J. Jensen, Bloomington; Charles J. Speerschneider, Minnetonka, all of Minn.

[73] Assignee: Honeywell Inc., Minneapolis, Minn.

[21] Appl. No.: 08/681,784

[22] Filed: Jul. 29, 1996

Related U.S. Application Data

[63] Continuation-in-part of application No. 08/490,635, Jun. 15, 1995, abandoned.

[51] Int. Cl.[6] .............................. H01L 23/49; H05K 7/02
[52] U.S. Cl. ...................... 361/770; 257/686; 257/777; 361/782; 361/783; 361/735
[58] Field of Search .................. 174/52.4, 138 G; 257/704, 707, 686, 685, 691, 711, 712, 713, 777, 684; 361/704, 707, 709, 712, 713, 722, 723, 735, 744, 770, 742, 804, 767, 775, 790, 807, 809, 820, 811, 812, 768, 771, 782, 783; 437/208, 209, 915; 439/68, 70, 71

[56] References Cited

U.S. PATENT DOCUMENTS

| | | |
|---|---|---|
| 4,996,587 | 2/1991 | Hinrichsmeyer et al. . |
| 5,012,323 | 4/1991 | Farnworth . |
| 5,019,943 | 5/1991 | Fassbender et al. ................ 361/735 |
| 5,049,676 | 9/1991 | Demmin et al. . |
| 5,291,061 | 3/1994 | Ball . |
| 5,323,060 | 6/1994 | Fogal et al. ........................ 257/777 |
| 5,399,898 | 3/1995 | Rostoker . |
| 5,422,435 | 6/1995 | Takiar et al. ..................... 174/52.4 |

FOREIGN PATENT DOCUMENTS

| | | | |
|---|---|---|---|
| 56-62351 | 5/1981 | Japan . | |
| 62-126661 | 6/1987 | Japan . | |
| 63-128736 | 6/1988 | Japan ................ | 257/686 |
| 64-28856 | 1/1989 | Japan . | |
| 3-169062 | 7/1991 | Japan . | |
| 4-56262 | 2/1992 | Japan ................ | 257/686 |
| 5-75014 | 3/1993 | Japan ................ | 257/777 |
| WO93/23982 | 11/1993 | WIPO ............... | 257/686 |

*Primary Examiner*—Donald Sparks
*Attorney, Agent, or Firm*—Gregory A. Bruns

[57] ABSTRACT

Chip stacking and capacitor mounting arrangement including a planar spacer separating a first die and a second die. A conductive spacer provides for backside chip grounding in one application and provides for capacitor mounting in another application.

23 Claims, 4 Drawing Sheets

CHIP STACKING AND CAPACITOR MOUNTING ARRANGEMENT INCLUDING SPACERS

This application is a continuation-in-part of application Ser. No. 08/490,635, filed Jun. 15, 1995, now abandoned.

BACKGROUND OF THE INVENTION

The present invention relates to integrated circuit (IC) assemblies, and more particularly to stacked arrangements for semiconductor dies or chips.

Semiconductor technology has shown a dramatic trend to increases in integrated circuit speed and density with general reduction in device size. Typically integrated circuit chips are assembled into integrated circuit packages by which electrical connections may be made to the integrated circuit from external systems. Without attendant improvements in the packaging of ICs, much of the benefit of high device speed may be lost due to wiring propagation delays and transmission line effects of integrated circuit packages and on circuit board assemblies.

Decoupling capacitors are required in many IC applications. One example of such an application is the need for certain IC devices to be insensitive to being bombarded by ionizing radiation. A basic effect oil the ionizing radiation is to generate electron hole pairs in the semiconductor material. In an IC having a power supply voltage and a ground voltage, the effect of being irradiated is to create a high current flow in the chip between the power supply voltage and the ground voltage. The further effect is for the current flowing from the power supply to encounter inductance in the connecting leads from the power supply. The result is that the on-chip voltage essentially collapses. A solution is to place a capacitor across the IC power supply as close as possible to the IC so that the capacitor is charged to the chip poser supply voltage.

Thus a need exists to provide a packaging arrangement which reduces propagation delays, reduces transmission line effects, provides for effective mounting and connection of decoupling capacitors, and provides more IC function per unit volume of space by increasing chip packaging density.

SUMMARY OF THE INVENTION

The present invention solves these and other needs by providing in a first aspect a chip stacking arrangement including a first die secured to a die mounting surface; wire bonds extending from bonding pads on the first die to external bonding pads; a planar spacer located within a space with a conductive surface at least partially bounded by bonding pads on the first die and secured by an adhesive layer;

a second die; secured to the spacer with the spacer having two tiers to allow clearance of the second die from the wire bonds connected to the first die; and wire bonds extending from pads on the second die to external bonding pads.

In a second aspect, the spacer extends beyond a perimeter of the first die.

In a third aspect a conductive spacer is used for mounting and connecting capacitors. Capacitors having opposite conductive faces for electrical connections have one face mounted directly to the conductive surface of a spacer and wire bond connections made to the other face When elongated capacitors having opposite conductive ends are used, an additional dielectric layer is provided on the conductive surface of the spacer, a metal layer is provided on the surface of the dielectric and openings are provided extending through the metal and dielectric layers with capacitors mounted and connected by conductive materials.

DETAILED DESCRIPTION OF THE INVENTION

Figure 1:
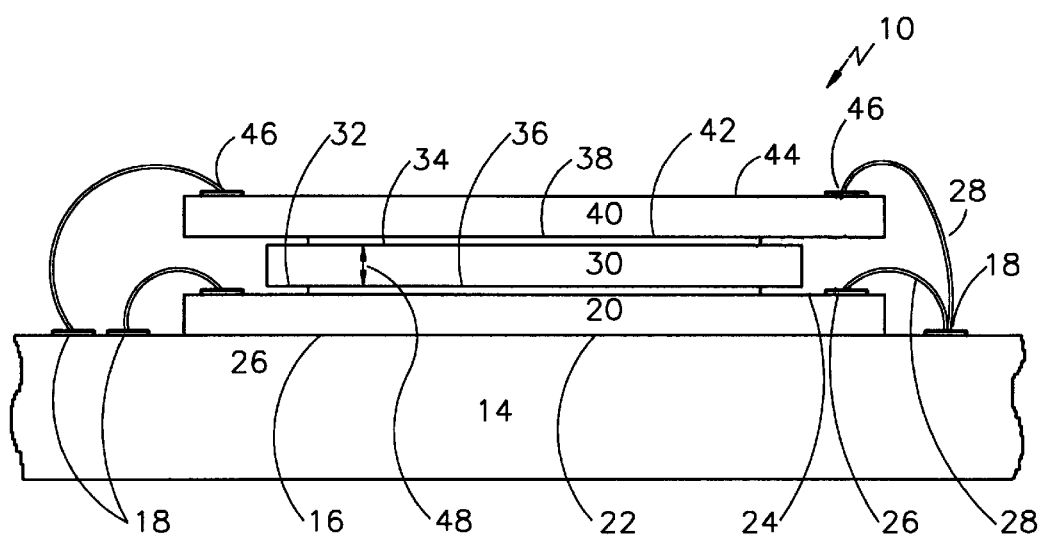
FIG. 1 is a cross-sectional view of a chip stacking arrangement according to the present invention.

A chip stacking arrangement is shown in the figures. and generally designated 10. As shown in FIG. 1, a portion of a semiconductor package 14 includes a die mounting surface 16 for receiving a semiconductor die or chip and bonding pads 18 located on package or substrate 14. A first chip 20 is mounted on surface 16 by conventional means. Chip 20 includes surface 22, surface 24, and wire bonding pads 26 at the perimeter of surface 24 for making electrical connections. Package 14 may be a ceramic package having a recess for chip 20 or package 14 may be a portion of a multichip module. Package or substrate 14 includes bonding pads 18 for making electrical connection to package conductive paths (not shown). Electrical connections between chip 20 and package 14 are made by thin wires 28 having a wire bond connection at wire bond pads 26 and at package bond pad 18. For example, aluminum or gold wire may be used and wedge or ball bonding may be used. Tape automated bonding (TAB) could also be used.

Arrangement 10 further includes planar spacer 30 having a lower surface 32 which is bonded to surface 24 of chip 20. Spacer 30 also includes upper surface 34 and may be of various materials and configurations depending on the application. A material such as silicon provides good thermal conductivity for heat dissipation and is matched to the thermal expansion coefficient of chip 20 and chip 40. In addition, silicon is easily machinable to allow good thickness control for accurate spacing. In FIG. 1, spacer 30 is made of silicon and has planar dimensions or is of a planar size to fit on surface 24 of chip 20 within an area at least partially defined by bonding pads 26. A spacer size approximately 40 mils smaller than the chip it is placed on has been found to be satisfactory in prototypes. In FIG. 1, spacer 30 is typically bonded to surface 24 using a nonconductive adhesive layer 36 after wirebond connections have been made to chip 20. Epoxy has been used satisfactorily as an adhesive. Then chip 40 is bonded to surface 34 of spacer 30 by adhesive layer 38 which may be an epoxy. Chip 40 includes surface 42, and surface 44 having wire bond pads 46. Electrical connections between chip 40 and package 14 are made by thin wires 28 having a wire bond connection at die bond pads 46 and at package bond pad 18. Thickness 48 of spacer 30 is selected so that surface 42 of chip 40 is spaced further from surface 24 of chip 20 than the highest point of wire bond connections 28 so that adequate clearance for the wirebonds is provided. For memory chips it is typical that some pads of each chip would be bonded in parallel to a pad or the package, that is, the same pad function of both chips can be joined together at the package bond pad. This statement usually applies to all the chip pads of a memory chip except the chip select or chip enable pad which would be kept separate or bonded to its own unique package or substrate pad. While only two chips are shown in FIG. 1 additional chip levels can be added by bonding an additional spacer 30 on surface 44 of chip 40.

Figure 2:
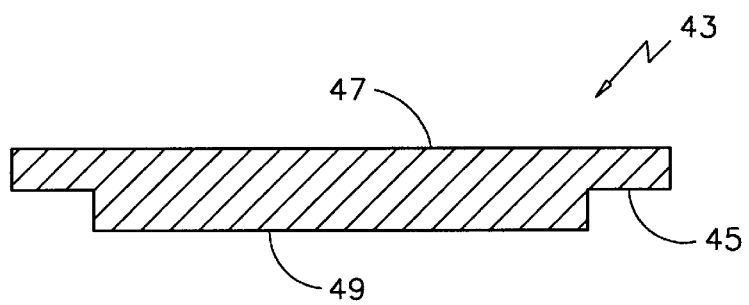
FIG. 2 is a cross sectional view of a chip having an integral spacer.
Figure 3:
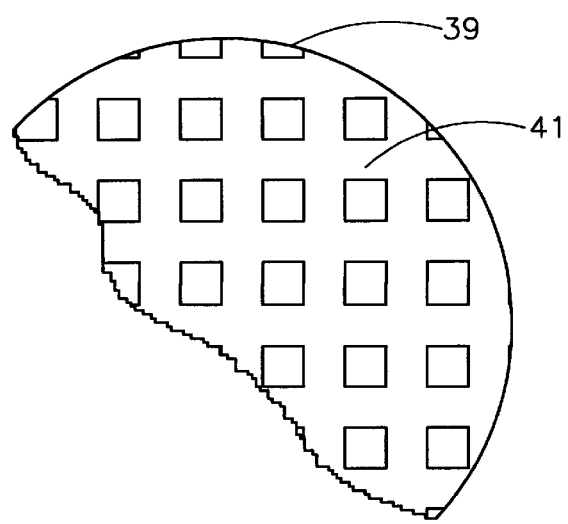
FIG. 3 is a plan view of a portion of the backside or bottom of a semiconductor wafer used to obtain the chip of FIG. 2.

In FIG. 1, a discrete spacer was illustrated. An alternative arrangement is to build the function of spacer 30 into the back of an active chip, for example, chip 40 of FIG. 1. The standoff or spacer function can be accomplished by chemically etching or mechanically sawing the back side of wafer 39 as shown in FIG. 3. In both cases, the backside of wafer 39 should have a channel approximately 0.040 inches removed on the opposite sides of wafer streets 41. The depth of the channels depends on the clearance needed for the wirebonds. A depth of 0.008 inches has been found to be satisfactory in prototypes. A cross sectional drawing of a an active chip 43 (not to scale) is shown in FIG. 2 including active die surface 47, area of silicon removal by chemical etching or mechanical sawing 45 and backside or mounting surface 49.

Figure 4:
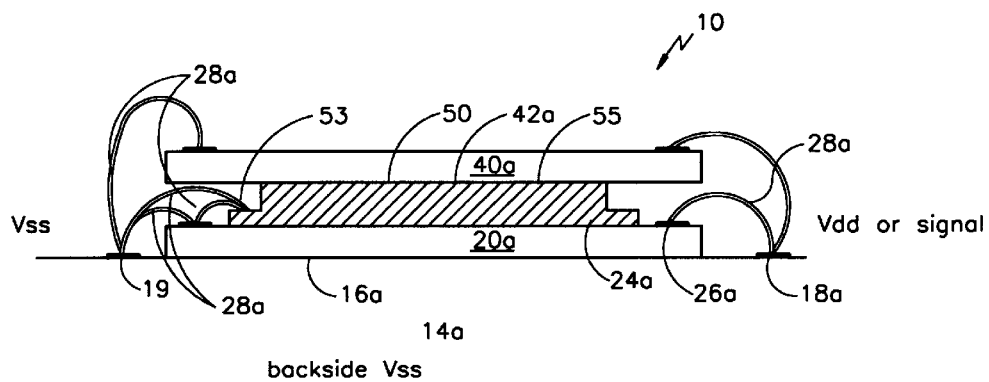
FIG. 4 is a cross-sectional drawing of an alternate embodiment of the present invention.

Some types of integrated circuits (ICs) require the backside of the chip to be connected to ground or Vss. A first alternative embodiment of arrangement 10 is shown in FIG. 4, including a package or substrate 14a having a die mounting surface 16a and package bonding pads 18a.

Figure 4A:
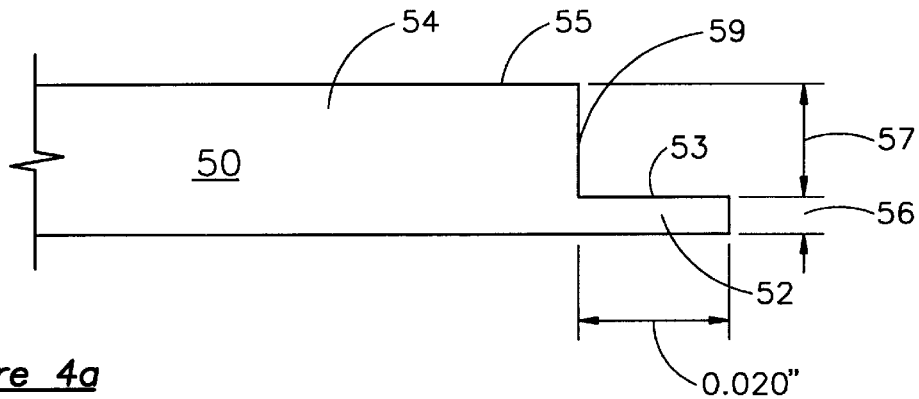
FIG. 4a is a cross-sectional view of a portion of FIG. 4.

Spacer 50, as shown in FIG. 4a, includes two tiers or horizontal surfaces, an extended lower or outer tier or shelf 52 having a surface 53 for attaching wirebonds, and an upper inner tier 54 having a surface 55 that contacts the bottom of an upper chip and provides clearance for the wire bond loop height. In one suggested design, lower tier 52 typically has a thickness 56 of at least 0.002 inches, upper tier 54 is recessed by about 0.020 inches from lower tier 52 and surface 55 of upper tier 54 has a height 57 from surface 53 of about 0.006 inches. Spacer 50 may be of various materials. Spacer 50 may be of a conductive material, for example aluminum. Alternatively, spacer 50 may be of a non conductive material with at least portions of surface 53 and surface 55 metallized and with the metallized portions electrically interconnected, for example by a metallized surface 59 joining them. Spacer 50 may be of silicon material for example with surfaces 53, 55, and 59 metallized with a wire bondable metal such as aluminum or gold.

Figure 4B:
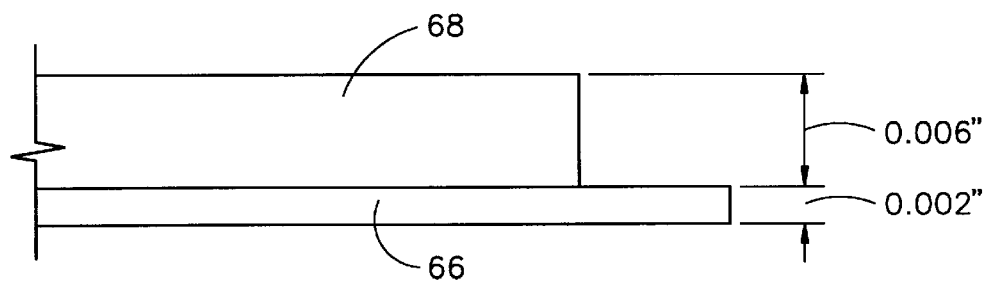
FIG. 4b is a cross-sectional view of an alternate construction of a spacer.

As shown in FIG. 4b, spacer 50 may be constructed from two separate pieces of, for example, aluminum joined together by electrically conductive epoxy. For example, a lower piece 66 leaving a thickness of about 0.002 inches and an upper piece 68 having a thickness of about 0.006 inches.

An advantage of a silicon spacer is that it is a good thermal conductor; it matches the thermal expansion of the die and it is easily machined by chemical or mechanical means. Other materials such as SiC, AlN, CuW are examples of other materials with high thermal conductivity and reasonable thermal match to silicon.

The use of spacer 50 may be explained as follows. Die 20a is mounted to surface 16a by conventional means. Electrical connections between chip 20a and package 14a are made by thin wires 28a having a wire bond connection for Vdd or signal at die bond pads 26a and at package bond pad 18a. Conductive spacer 50 is then bonded on top surface 24a of die 20a with a conductive or non conductive adhesive material. Examples of electrically nonconductive materials include nonconductive epoxies or polyimide. Often these bonding agents are loaded with electrically insulating thermally conductive materials such as alumina, diamond or aluminum nitride. Examples of electrically conductive adhesives include metal loaded epoxies and polyimides. Electrical connections are then made by thin wires 28a having a wire bond connection at surface 53 of spacer 50 and to a package bond pad at 19. Alternatively, a wire bonds may be made between surface 53 and a ground pad on die 20a. Power (Vdd) or signal connections can be made from pads such as 18a. A top or second die 40a is then bonded to surface 55 of spacer 50. An electrically conductive adhesive or bonding material is required for electrical contact between backside or surface 42a of chip 40a and surface 55 of spacer 50. Additional chip levels can be added to the stack by bonding additional spacers and active chips on top of previous chips that have already had wirebond connections made.

Figure 5:
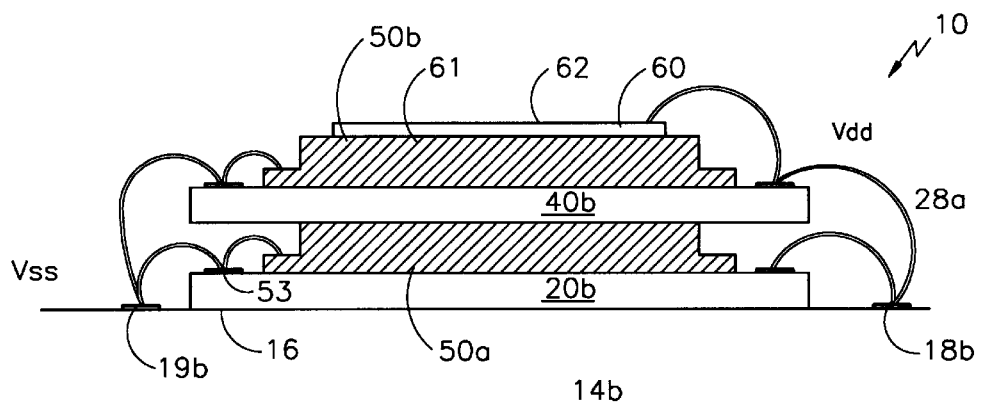
FIG. 5 is cross-sectional view of an alternate embodiment of the present invention.

It is frequently necessary to provide an arrangement for connecting capacitors to IC chips. Conductive spacer 50 permits capacitors to be mounted on top of a single chip or on top of a stack of chips. For example, in FIG. 5, capacitor 60 is a large area capacitor with power and ground connections made at the two large faces 61 and 62. As shown in FIG. 5, the connection of chip 20b to package 14b, the mounting and connection of spacer 50a to chip 20b, and the mounting and connection of chip 40b is similar to that described for similar components in FIG. 4. Conductive spacer 50b is bonded to chip 40b with a conductive or nonconductive adhesive. A wire bond connection is made from surface 53 of spacer 50b to a ground pad on chip 40b. Alternatively, surface 53 could be connected directly to ground (Vss) pad 19b on package 14b. Capacitor 60 is then bonded to spacer 50b with a conductive adhesive so that bottom face 61 is in electrical contact with the top surface of spacer 50b and is effectively grounded. FIG. 5 shows a capacitor mounting arrangement with a two-tiered conductive spacer 50b. It is clear however that a spacer without two tiers, that is, a spacer with a planar upper conductive surface wherein a ground connection was made to a location on the conductive surface, could also be used. A power (Vdd) connection to surface 62 of capacitor 60 is made by a wire bond from a power pad on chip 40b or power pad 18b on package 14b.

Figure 6:
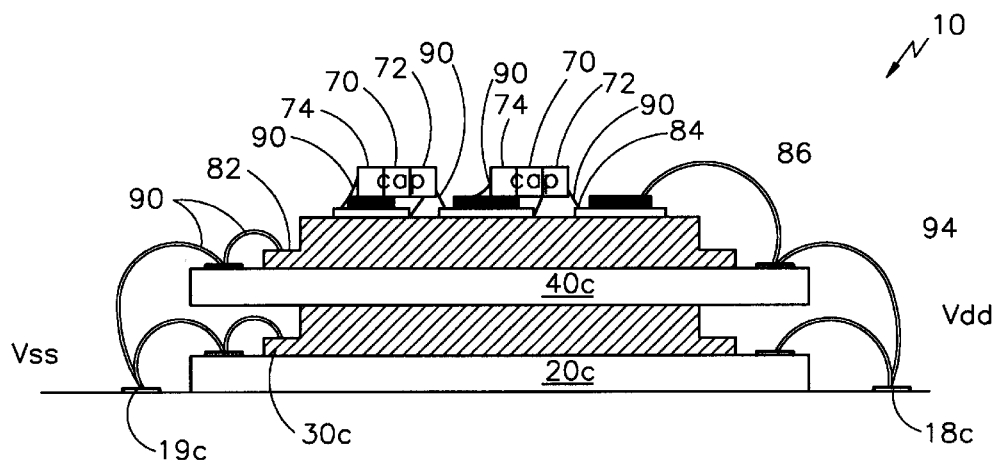
FIG. 6 is a cross-sectional view of an alternate embodiment of the present invention.
Figure 7:
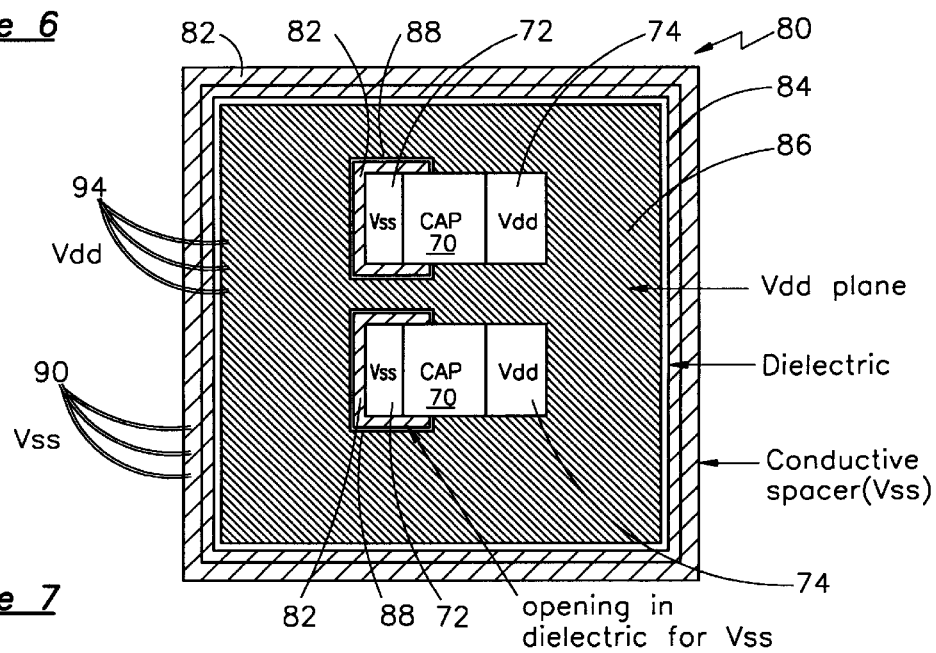
FIG. 7 is a top plan view of an alternate embodiment similar to that of FIG. 6.

An alternative embodiment which includes a capacitor mounting feature is shown in FIGS. 6 and 7 where discrete capacitors 70 having a conductive end 72 for connection to ground and conductive end 74 for connection to power. For example, type 1206 capacitors may be used. In this embodiment the assembly process is the same as FIG. 5 up through the mounting and connection of second chip 40c. Conductive spacer 80 is a modification of conductive spacer 50 that is described as follows. Conductive surface 82 corresponds to conductive surface 55 of spacer 50. A dielectric material layer 84 such as a polymer film or a thick dielectric paste, must be bonded to or deposited on surface 82. Thin metal layer or film 86 is then deposited on top of dielectric layer 84. Openings 88 are then made in metal layer 86 and dielectric layer 84 to expose conductive surface 82 of spacer 80. Capacitors 70 are bonded to spacer 80 with an electrically conductive material 90 such as conductive adhesive or solder or other conductive material. Capacitors 70 then have ends 72 connected to conductive surface 82 and ends 74 connected to metal layer 86. Wire bonds 90 are made between conductive surface 82 and a ground pad on chip 40c or alternatively to a ground pad on package 14c. Additional wire bonds 94 are made from metal layer 86 to a power pad on chip 40c or alternatively to a power pad on package 14c. FIGS. 6 and 7 show the use of a two tiered conductive spacer 40c. However, a spacer having a planar conductive surface could also be used if a portion of the conductive surface were left exposed for connection to ground.

Figure 8:
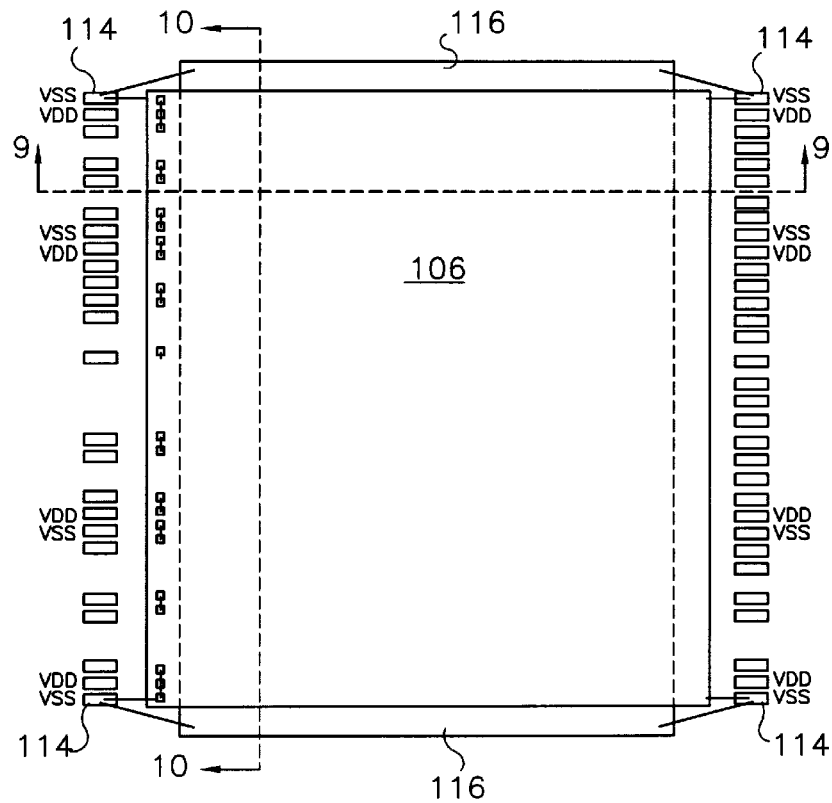
FIG. 8 shows a top plan view of an alternate embodiment of the present invention.
Figure 9:
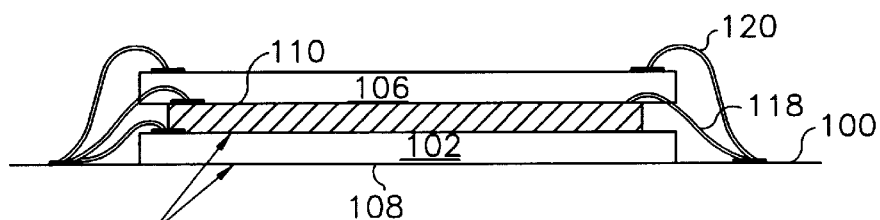
FIG. 9 shows a cross-sectional view along section line 9—9 of FIG. 8.
Figure 10:
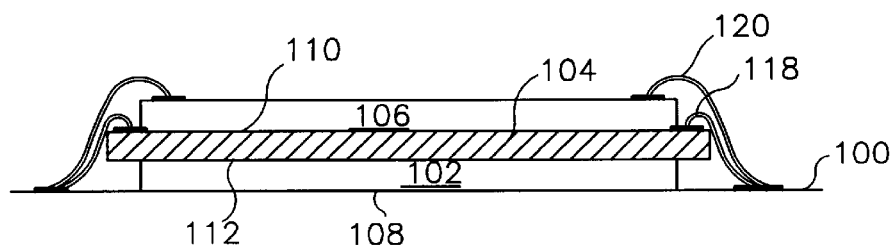
FIG. 10 shows a cross-sectional view along section line 10—10 of FIG. 8.

An alternate embodiment is shown in FIGS. 8–10.

FIG. 10 shows an elevation view of a die mounting surface 100, first die 102, conductive spacer 104 and second die 106. Backside grounding of die 102 and die 106 is provided by conductive epoxy at 108 and 110 respectively. Non-conductive epoxy at 112 secures spacer 104 to die 102.

$V_{SS}$ or ground pads 114 are located on die mounting surface 100. Spacer 104 may be fabricated from conductive material or may be fabricated from silicon and provided with a conductive surface 116. A wirebond connection such as 118 connects surface 116 to a ground pad 114. A wirebond connection such as 120 connects ground pad 114 to a ground pad on die 106. Spacer 104 is located on die 102 in an area that is partially bounded by a row of bond pads along an edge of die 102. Spacer 104 then extends outwardly from between die 102 and die 106 to allow wire bond connections to be made to spacer 104 which effectively grounds the backside of die 106.

Those of ordinary skill in the art will recognize that variations may be made in the materials and the process just described. For example, metal layer or film 86 may be previously bonded to dielectric layer 84, such as in a metal clad flexible polymer film. As a further example, the openings in dielectric layer 84 may be patterned before depositing and patterning metal film 86.

The scope of the invention is to be indicated by the appended claims, rather than the foregoing description.

We claim:

1. Component stacking arrangement comprising:
   a die mounting surface;
   a first die secured to said die mounting surface;
   a first plurality of thin wires extending from a plurality of first bonding pads on said first die to a second plurality of bonding pads external to said first die;
   spacer means located within an area at least partially bounded by said first plurality of bonding pads, said spacer means secured at a first surface of said first die, said spacer means having an outer tier and a central tier with said tiers having electrically interconnected conductive surfaces;
   at least a first conductor electrically connecting said conductive surface of said outer tier to a first voltage; and
   a component having a conductive backside, said component secured at said conductive backside to said spacer means, with said spacer means having a thickness such that a surface of said component facing said first die is spaced further from said first die than a highest point of said first plurality of thin wires and a highest point of said first conductor.

2. Component stacking arrangement of claim 1, wherein said spacer means comprises silicon and said conductive surfaces comprise a metal suitable for wire bond connections.

3. Component stacking arrangement of claim 2, wherein said component is a second die, further comprising:
   a second spacer means secured to a surface of said second die; said second spacer means having a conductive surface:
   capacitor means having a first conductive face and a second conductive face, said first conductive face secured to said conductive surface of said second spacer by a conductive material;
   means for electrically connecting said conductive surface of said second spacer means to said first voltage; and
   means for electrically connecting said second conductive face to a second voltage.

4. Component stacking arrangement of claim 2 wherein said component is a second die, further comprising:
   a second spacer means secured to a surface of said second die; said second spacer means having a conductive surface:
   a dielectric layer secured to said conductive surface of said second spacer means;
   an electrically conductive layer secured to said dielectric layer;
   an opening extending through said electrically conductive layer and through said dielectric to expose said electrically conductive surface of said second spacer means;
   capacitor means having a first conductive end and a second conductive end, said first conductive end secured to said conductive surface by a conductive material, said second conductive end secured to said conductive layer by a conductive material;
   means for electrically connecting said conductive surface of said second spacer means; and
   means for electrically connecting said conductive layer to a second voltage.

5. Component stacking arrangement of claim 4 wherein said dielectric layer and said conductive layer are bonded together before being applied to said conductive surface of said central tier.

6. Component stacking arrangement of claim 1 wherein said spacer means is formed by wafer level processes.

7. Component stacking arrangement of claim 1 wherein said spacer means comprises a material selected from the group consisting of silicon carbide, aluminum nitride and copper tungsten.

8. Component stacking arrangement of claim 1 wherein said first conductor comprises wire bond means.

9. Stacking arrangement of claim 1 wherein said first voltage is located on said first die.

10. Stacking arrangement of claim 1 wherein said first voltage is located external to said first die.

11. Component stacking arrangement, comprising:
    a chip mounting surface;
    a first chip attached to said surface;
    a multiplicity of thin wires connecting bonding pads on said first chip to bonding pads external to said first chip;
    a spacer means having a first and second tier having electrically conducting and electrically connected first and second surfaces, said first tier to be of planar dimensions fitting within a space defined by said bonding pads on said first chip and said second tier smaller in planar dimension than said first tier;

conductor means extending from said first tier to a first voltage; and a second chip secured to said second surface on said spacer means, with said spacer means being of such thickness as to allow clearance for the highest reach of said multiplicity of thin wires and said conductor means from the lowest most surface of said second chip.

12. Component stacking arrangement of claim 11, where said spacer means comprises silicon and said conductive surfaces comprise a metal and are suitable for wire bond connections.

13. The integrated circuit component stacking arrangement of claim 11, where said spacer means comprises a material selected from the group consisting of silicon carbide, aluminum nitride, and copper tungsten.

14. The component stacking arrangement of claim 11 further comprising:

a second spacer means having a conductive surface said second spacer means secured to the surface of said second chip; and a capacitor means mounted on said second spacer means.

15. Component stacking arrangement of claim 14 wherein said capacitor means comprises:

a planar capacitor having first and second conductive faces with said first conductive face secured to said conductive surface of said second spacer means; and wire bond means for connecting said second face to a second voltage.

16. Stacking arrangement of claim 14 further comprising:

means for electrically connecting said second spacer means conductive surface to said first voltage;

a dielectric layer attached to said second spacer means conductive surface;

an electrically conductive layer attached to said dielectric layer;

an opening extending through said electrically conductive layer and said dielectric layer exposing said second spacer means conductive surface;

said capacitor means having first and second conductive ends, with said first conductive end attached to said electrically conductive layer by an electrically conductive means and said second conductive end attached to said second spacer means conductive surface through said opening by an electrically conductive means; and means for electrically connecting said electrically conductive layer to a second voltage.

17. Component stacking arrangement of claim 16 wherein said dielectric layer and said conductive layer are bonded together before being applied to said conductive surface of said central tier.

18. Component stacking arrangement comprising:

a die mounting surface;

a first die secured to said die mounting surface;

a first plurality of thin wires extending from a plurality of bonding pads on said first die;

first spacer means having a conductive surface, said first spacer means located within an area partially bounded by said plurality of bonding pads and having an extended portion;

first conductor means extending from said conductive surface of said extended portion to a first voltage; and a second component having a conductive backside, said second component secured to said conductive surface at said conductive backside with said extended portion extending beyond a perimeter of said second component in a first direction.

19. Stacking arrangement of claim 18 wherein said first spacer means comprises silicon and said conductive surface comprises a metal suitable for wire bond connections.

20. Stacking arrangement of claim 18 wherein said first spacer means comprises a nonconductive material and said conductive surface comprises a metal suitable for wire bond connections.

21. Stacking arrangement of claim 18 wherein said first spacer means comprises a conductive material and said conductive surface comprises a metal suitable for wire bond connections.

22. Component stacking arrangement of claim 18 wherein said component is a second die.

23. Component stacking arrangement of claim 18 wherein said component is a capacitor.

* * * * *